United States Patent
Lee et al.

(10) Patent No.: US 8,009,454 B2
(45) Date of Patent: Aug. 30, 2011

(54) RESISTANCE RANDOM ACCESS MEMORY DEVICE AND A METHOD OF MANUFACTURING THE SAME

(75) Inventors: Myoung-jae Lee, Yongin-si (KR);
Yoon-dong Park, Yongin-si (KR);
Hyun-sang Hwang, Yongin-si (KR);
Dong-soo Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/654,003

(22) Filed: Jan. 17, 2007

(65) Prior Publication Data
US 2007/0215977 A1    Sep. 20, 2007

(30) Foreign Application Priority Data
Mar. 10, 2006  (KR) .................. 10-2006-0022728

(51) Int. Cl.
G11C 11/00    (2006.01)

(52) U.S. Cl. .................. 365/148; 355/46; 257/4; 257/5; 257/E27.104; 257/E29.17

(58) Field of Classification Search .................. 365/148
See application file for complete search history.

(56) References Cited

U.S. PATENT DOCUMENTS

| | | | |
|---|---|---|---|
| 5,087,589 A * | 2/1992 | Chapman et al. | 438/467 |
| 6,136,161 A * | 10/2000 | Yu et al. | 204/192.29 |
| 7,154,769 B2 * | 12/2006 | Krieger et al. | 365/148 |
| 7,193,890 B2 * | 3/2007 | Nagase et al. | 365/158 |
| 2003/0155602 A1 | 8/2003 | Krieger et al. | |
| 2004/0235214 A1 * | 11/2004 | Burgener et al. | 438/48 |
| 2004/0245557 A1 * | 12/2004 | Seo et al. | 257/298 |
| 2004/0265645 A1 * | 12/2004 | Noguchi et al. | 428/694 ML |
| 2005/0152175 A1 * | 7/2005 | Ashton et al. | 365/148 |
| 2005/0194622 A1 * | 9/2005 | Lee et al. | 257/288 |
| 2005/0213368 A1 * | 9/2005 | Rinerson et al. | 365/148 |
| 2006/0113573 A1 * | 6/2006 | Cheong et al. | 257/246 |
| 2007/0069883 A1 * | 3/2007 | Collier et al. | 340/538 |
| 2007/0114587 A1 | 5/2007 | Seo et al. | |
| 2008/0062581 A1 * | 3/2008 | Parkin | 360/324.11 |

FOREIGN PATENT DOCUMENTS

| | | |
|---|---|---|
| CN | 1574363 | 2/2005 |
| EP | 1484799 | 12/2004 |
| JP | 2002-076356 | 3/2002 |
| JP | 2004-348850 | 12/2004 |

(Continued)

OTHER PUBLICATIONS

Chinese Office Action dated Jan. 8, 2010 in corresponding Chinese Application No. 2006101701004, with English translation.

(Continued)

Primary Examiner — Sue Purvis
Assistant Examiner — Fei Fei Yeung Lopez
(74) Attorney, Agent, or Firm — Harness, Dickey & Pierce, P.L.C.

(57) ABSTRACT

Provided is a resistance random access memory (RRAM) device and a method of manufacturing the same. A resistance random access memory (RRAM) device may include a lower electrode, a first oxide layer on the lower electrode and storing information using two resistance states, a current control layer made of a second oxide on the first oxide layer and an upper electrode on the current control layer.

10 Claims, 5 Drawing Sheets

FOREIGN PATENT DOCUMENTS

| | | | |
|---|---|---|---|
| JP | 2005-135462 | | 5/2005 |
| JP | 2005-203733 | | 7/2005 |
| JP | 2005-317976 | | 11/2005 |
| WO | WO2006009218 | * | 1/2006 |

OTHER PUBLICATIONS

Japanese Office Action dated Sep. 8, 2009, Japan.
Chinese Rejection Decision dated Aug. 12, 2010 issued in corresponding Chinese Application No. 200610171100.4.
Office Action dated Jul. 10, 2009 issued in corresponding Chinese Application No. 200610171100.4 and English translation thereof.
Office Action dated May 11, 2010 issued in corresponding Chinese Application No. 200610171100.4 and English translation thereof.
Chinese Rejection Decision dated Aug. 12, 2010 issued in corresponding Chinese Application No. 200610171100.4 and English translation thereof.
Office Action dated Dec. 22, 2010 with English translation for corresponding Japanese Patent Application No. 2007-050627.

* cited by examiner

RESISTANCE RANDOM ACCESS MEMORY DEVICE AND A METHOD OF MANUFACTURING THE SAME

PRIORITY STATEMENT

This application claims priority under 35 USC §119 to Korean Patent Application No. 10-2006-0022728, filed on Mar. 10, 2006, in the Korean Intellectual Property Office (KIPO), the entire contents of which are incorporated herein by reference.

BACKGROUND

1. Field

Example embodiments relate to a resistance memory device and a method of manufacturing the same. Other example embodiments relate to a resistance random access memory (RRAM) device driven at a lower power and a method of manufacturing the same.

2. Description of the Related Art

RRAMs mainly use characteristics (resistance change characteristics) by which resistance values vary with voltages of transition metal oxides and include central oxide layers and upper and lower electrodes. Referring to FIG. 1A, a memory device 10 may include a lower electrode 11, an oxide layer 12, and an upper electrode 13 sequentially stacked. The oxide layer 12 may operate as a memory node and may be made of a metal oxide having a variable resistance characteristic, for example, ZnO, $TiO_2$, $Nb_2O_5$, $ZrO_2$ and/or NiOx.

A RRAM using $NiO_x$, $ZrO_x$ and/or $Nb_2O_{5-x}$ may be a volatile memory having a higher switching endurance characteristic, retention characteristic, and other similar characteristics. Various materials for the RRAM have been studied. FIG. 1B is a graph illustrating a current-voltage characteristic of a conventional resistance memory device using NiOx as a memory node. As shown in FIG. 1B, a current of about 3 mA or more may be required to operate the conventional resistance memory device. In other words, the conventional resistance memory device may operate at a voltage and current having predetermined or given values and/or values higher than the predetermined or given values. The current may be lowered and if this occurs, the conventional resistance memory device may consume a smaller amount of power. Accordingly, there may be a need for lower power consumption of resistance memory devices, as is true for other types of memory devices.

SUMMARY

Example embodiments provide a lower power resistance random access memory (RRAM) device and a method of manufacturing the same.

According to example embodiments, a RRAM (resistance random access memory device) device may include a lower electrode, a first oxide layer on the lower electrode and storing information using two resistance states, a current control layer made of a second oxide on the first oxide layer and an upper electrode stacked on the current control layer.

According to example embodiments, a method of manufacturing a RRAM (resistance random access memory device) device may include providing a lower electrode, forming a first oxide layer on the lower electrode and storing information using two resistance states, forming a current control layer made of a second oxide on the first oxide layer and forming an upper electrode on the current control layer.

The first oxide layer may be made of one selected from the group consisting of NiOx, ZrOx, $Nb_2O_{5-x}$, HfO, ZnO, $WO_3$, CoO, $CuO_2$, and $TiO_2$. The current control layer may be made of one of ZnOx and RuOx doped with transition metals or a transition metal oxide. The current control layer may be made of one of ZnO and RuOx doped with one of Al and In or one of $SiO_2$ and Zr-rich $ZrO_2$ doped with metals. The current control layer may have a resistance within a range of between about 10 ohm and about 10 k ohm.

BRIEF DESCRIPTION OF THE DRAWINGS

Example embodiments will be more clearly understood from the following detailed description taken in conjunction with the accompanying drawings. FIGS. 1A-4 represent non-limiting, example embodiments as described herein.

FIG. 1A is a diagram of a conventional resistance random access memory (RRAM) device;

FIG. 3 is a graph illustrating a current-voltage characteristic of a RRAM according to example embodiments; and FIG. 4 is a graph illustrating switching cycles of a RRAM device of example embodiments and a conventional RRAM device with respect to variations in resistances in higher and lower resistance states.

DETAILED DESCRIPTION OF EXAMPLE EMBODIMENTS

Figure 1A:
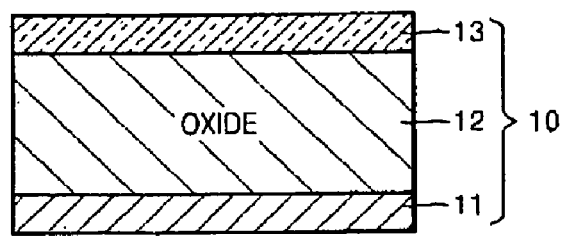
Figure 1B:
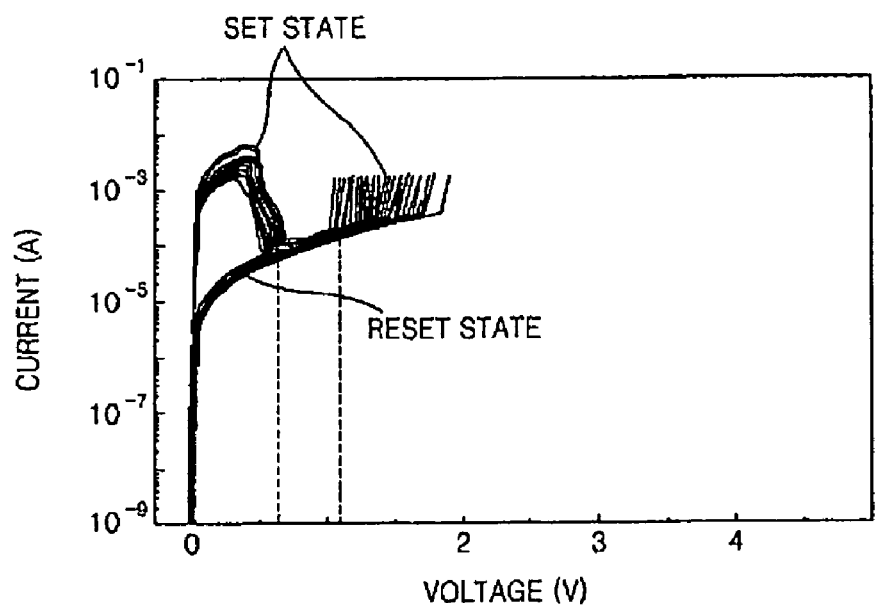
FIG. 1B is a graph illustrating a current-voltage characteristic of a conventional RRAM device.

Hereinafter, a RRAM device according to example embodiments will be described in detail with reference to the attached drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
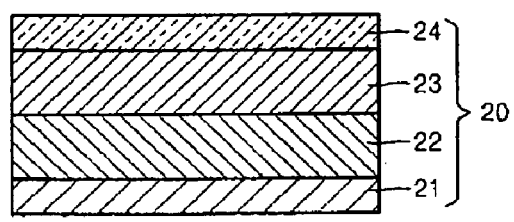
FIG. 2A is a diagram of a RRAM device according to example embodiments.

FIG. 2A is a diagram of a RRAM device 20 according to example embodiments. Referring to FIG. 2A, the RRAM device 20 may include a lower electrode 21, a first oxide layer 22, a current control layer 23 and an upper electrode 24. The first oxide layer 22 may have a variable resistance characteristic and may be a memory node made of a transition metal oxide having two resistance states. The transition metal oxide may be NiOx, ZrOx, $Nb_2O_{5-x}$, HfO, ZnO, $WO_3$, CoO, $CuO_2$ and/or $TiO_2$. In example embodiments, the first oxide layer 22 may be made of NiOx, ZrOx, $Nb_2O_{5-x}$, HfO, ZnO, $WO_3$, CoO, $CuO_2$ and/or $TiO_2$.

As a characteristic of example embodiments, the current control layer 23 may be made of a second oxide on the first oxide layer 22. The current control layer 23 may be made of a metal oxide. According to example embodiments, the current control layer 23 may be made of ZnOx and/or RuOx doped with In, Al and/or a transition metal. According to example embodiments, the current control layer 23 may be made of $SiO_2$ and/or Zr-rich $ZrO_2$ doped with a metal. The current control layer 23 may have a resistance within a range of between about 10 ohm and about 10 k ohm. The lower electrode 21 and/or the upper electrode 24 may be made of a metal and/or a metal oxide having electrical conductivity. For example, the lower and/or upper electrode 21 or 24 may be made of Ir, Ru, Pt and/or an oxide of Ir, Ru, or Pt.

Figure 2B:
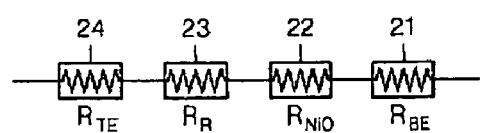
FIG. 2B is an electrical equivalent circuit diagram of the RRAM device shown in FIG. 2A.

The current control layer 23 may have a resistance within the range of between about 10 ohm and about 10 kohm. The RRAM device 20 according to example embodiments may have an equivalent circuit as shown in FIG. 2B. Referring to FIG. 2B, $R_{TE}$, $R_R$, $R_{NiO}$, and $R_{BE}$ may denote resistances of the upper electrode 24, the current control layer 23, the first oxide layer 22, and the lower electrode 21, respectively. The resistances $R_{TE}$, $R_R$, $R_{NiO}$, and $R_{BE}$ may be connected to one another in series, and 1-bit information may be stored according to a state of the resistance $R_{NiO}$ of the first oxide layer 22.

Figure 2C:
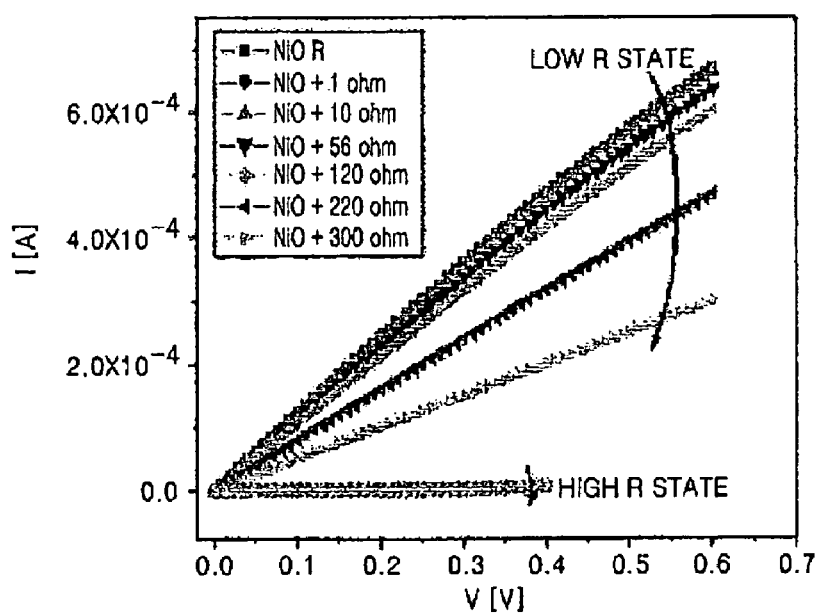
FIG. 2C is a graph illustrating current-voltage characteristics of RRAM devices according to example embodiments.

FIG. 2C is a graph illustrating a current-voltage characteristic with respect to variations (about 1, 10, 56, 120, 220, and 300 ohm) in resistance of a current control layer when a first oxide layer may be made of NiO and the current control layer may be made of ZnO doped with Al in a RRAM device according to example embodiments. As shown in FIG. 2C, current may decrease with an increase in the resistance of the current control layer when in a lower resistance state. Current may not flow regardless of the resistance when in a higher resistance state.

Figure 3:
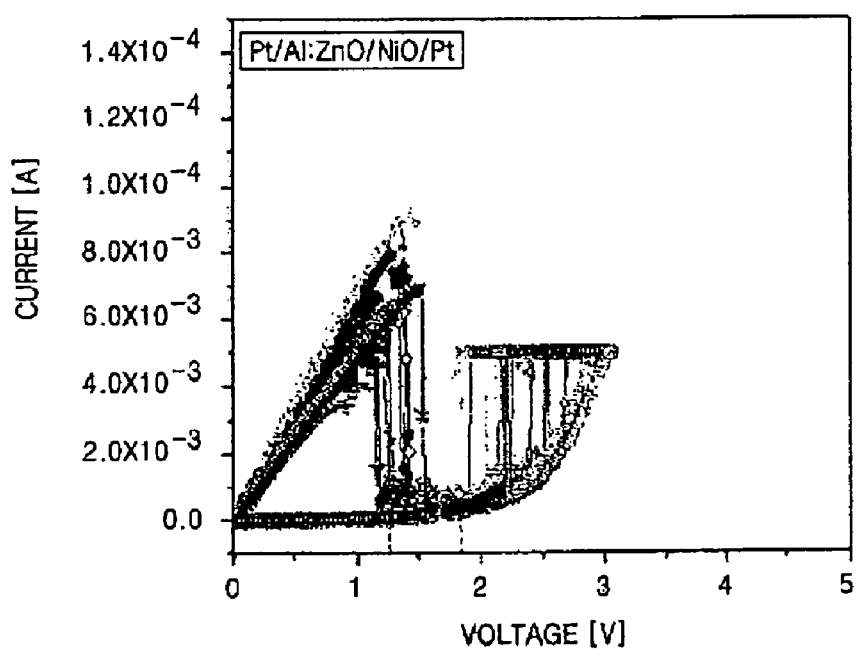

FIG. 3 is a graph illustrating a current-voltage characteristic of a RRAM device, according to example embodiments, as the measurement result of a switching operation after a ZnO layer doped with Al may be deposited on a NiO layer to a thickness of about 15 nm. As shown in FIG. 3, switching may occur at a peak current of about 100 A or less. The peak current may be adjusted through an optimization process.

Figure 4:
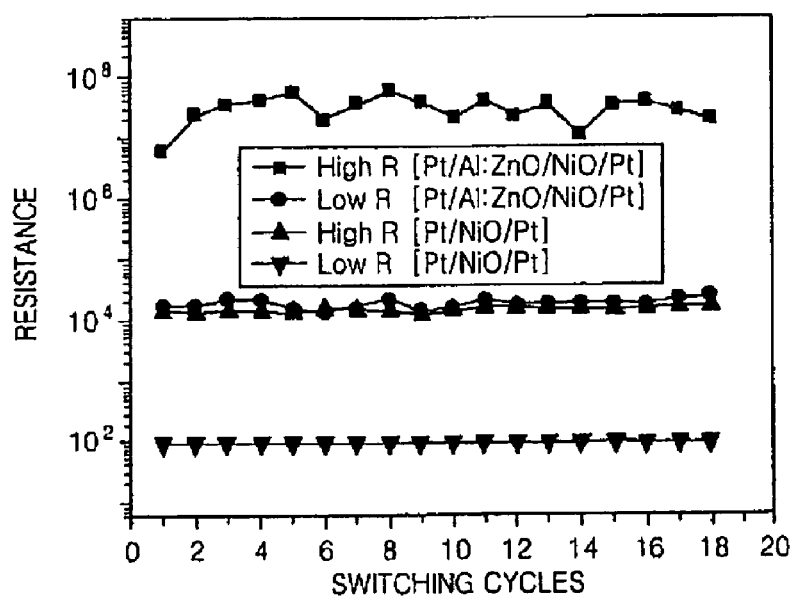

FIG. 4 is a graph illustrating switching cycles of a RRAM device of example embodiments and a conventional RRAM device with respect to variations in resistances in higher and lower resistance states. As shown in FIG. 4, an on current may be reduced at least about 100 times or more according to the result of a comparison of a resistance value measured when an existing NiO RRAM may be turned on and/or off and a resistance value measured when a ZnO layer doped with Al used for controlling a current may be deposited on the NiO.

According to example embodiments, a higher on-current (peak current>about 3 mA) of a thin film made of NiO, $ZrO_x$ and/or $Nb_2O_{5-x}$ for realizing two resistance states may be lowered to about 100 μA in a RRAM which is being developed as memory technology. A lower power memory device may be realized to solve the problem of higher power consumption in a conventional resistance memory device. A doped oxide thin film having a specific resistance value between specific resistance values of an oxide and an insulator may contribute to reducing a higher on-current of a conventional memory device having a RRAM thin film made of NiO, $ZrO_x$ and/or $Nb_2O_{5-x}$ at least about 100 times or more. An on-current may be substantially lowered to hundreds of μA so as to realize a lower power memory device.

A process of fabricating a RRAM device according to example embodiments may be a generally known semiconductor process of fabricating a general DRAM. Although an existing RRAM device made of $NiO_x$, $ZrO_x$ and/or $Nb_2O_{5-x}$ has a higher switching endurance characteristic, a higher retention characteristic, a higher operation voltage, and other similar characteristics, the existing RRAM device may not be realized as a lower power device due to a higher on-current (peak current>about 3 mA). A doped oxide layer for controlling a current may be made on a RRAM material to realize a lower power memory device.

A higher on-current of a RRAM thin film made of NiO, $ZrO_x$ and/or $Nb_2O_{5-x}$ may be reduced at least about 100 times or more using a doped oxide layer having a specific resistance value between specific resistance values of an oxide and an insulator. The on-current may be reduced to several hundreds of μA. Example embodiments may be applied to a RRAM device using an oxide having two resistance states.

While example embodiments have been particularly shown and described with reference to example embodiments thereof, it will be understood by those of ordinary skill in the art that various changes in form and details may be made therein without departing from the spirit and scope of the following claims.

What is claimed is:

1. A RRAM (resistance random access memory device) device comprising:
   a lower electrode;
   a first oxide layer on the lower electrode and storing information using two resistance states, wherein the first oxide layer is made of one selected from the group consisting of $NiO_x$, $ZrO_x$, $Nb_2O_{5-x}$, HfO, ZnO, $WO_3$, CoO, $CuO_2$, and $TiO_2$;
   a current control layer made of a second oxide on the first oxide layer; and
   an upper electrode on the current control layer,
   wherein the current control layer has a resistance within a range between about 10 ohm and about 10 kohm, and
   wherein the first oxide layer directly contacts the lower electrode, and the current control layer directly contacts the upper electrode.

2. The RRAM device of claim 1, wherein the current control layer is made of one of ZnOx and RuOx which are doped with transition metals.

3. The RRAM device of claim 1, wherein the current control layer is made of a transition metal oxide.

4. The RRAM device of claim 1, wherein the current control layer is made of one of ZnO and RuOx which are doped with one of Al and In.

5. The RRAM device of claim 1, wherein the current control layer is made of one of $SiO_2$ and Zr-rich $ZrO_2$ which are doped with metals.

6. A method of manufacturing a RRAM (resistance random access memory device) device comprising:
   providing a lower electrode;
   forming a first oxide layer on the lower electrode and storing information using two resistance states, wherein the first oxide layer is made of one selected from the group consisting of $NiO_x$, $ZrO_x$, $Nb_2O_{5-x}$, HfO, ZnO, $WO_3$, CoO, $CuO_2$, and $TiO_2$;
   forming a current control layer made of a second oxide on the first oxide layer; and
   forming an upper electrode on the current control layer,
   wherein the current control layer has a resistance within a range between about 10 ohm and about 10 kohm, and
   wherein the first oxide layer directly contacts the lower electrode, and the current control layer directly contacts the upper electrode.

7. The method of claim 6, wherein the current control layer is made of one of ZnOx and RuOx which are doped with transition metals.

8. The method of claim 6, wherein the current control layer is made of a transition metal oxide.

9. The method of claim 6, wherein the current control layer is made of one of ZnO and RuOx which are doped with one of Al and In.

10. The method of claim 6, wherein the current control layer is made of one of $SiO_2$ and Zr-rich $ZrO_2$ which are doped with metals.

* * * * *